United States Patent
Chen et al.

(10) Patent No.: US 7,008,826 B2
(45) Date of Patent: Mar. 7, 2006

(54) LEAD-FRAME-BASED SEMICONDUCTOR PACKAGE AND FABRICATION METHOD THEREOF

(75) Inventors: Holman Chen, Taichung (TW);
Chien-Ping Huang, Hsinchu (TW);
Chin-Yuan Hong, Taichung (TW);
Jui-Hsiang Hung, Changhua (TW);
Chin-Teng Hsu, Taichung (TW)

(73) Assignee: Siliconware Precision Industries, Co., Ltd., (TW)

( * ) Notice: Subject to any disclaimer, the term of this patent is extended or adjusted under 35 U.S.C. 154(b) by 0 days.

(21) Appl. No.: 10/938,144

(22) Filed: Sep. 10, 2004

(65) Prior Publication Data

US 2005/0029639 A1      Feb. 10, 2005

Related U.S. Application Data

(62) Division of application No. 10/211,422, filed on Aug. 2, 2002, now Pat. No. 6,806,565.

(30) Foreign Application Priority Data

Jul. 5, 2002    (TW) .................................. 91114917 A

(51) Int. Cl.
*H01L 21/50* (2006.01)
*H01L 23/495* (2006.01)

(52) U.S. Cl. ...................... 438/123; 257/666; 257/674; 257/676

(58) Field of Classification Search ................. 438/123; 257/666, 674, 676
See application file for complete search history.

(56) References Cited

U.S. PATENT DOCUMENTS

| | | | | | |
|---|---|---|---|---|---|
| 5,521,429 | A | * | 5/1996 | Aono et al. | 257/676 |
| 5,703,399 | A | * | 12/1997 | Majumdar et al. | 257/723 |
| 5,977,613 | A | * | 11/1999 | Takata et al. | 257/666 |
| 6,187,614 | B1 | * | 2/2001 | Takata et al. | 438/112 |
| 6,580,161 | B1 | * | 6/2003 | Kobayakawa | 257/676 |
| 6,624,007 | B1 | * | 9/2003 | Kobayakawa et al. | 438/123 |
| 6,759,737 | B1 | * | 7/2004 | Seo et al. | 257/686 |
| 2002/0121684 | A1 | * | 9/2002 | Kobayakawa | 257/676 |
| 2002/0187584 | A1 | * | 12/2002 | Bolken | 438/106 |

* cited by examiner

*Primary Examiner*—Zandra V. Smith
*Assistant Examiner*—Mark A. Baumgardner
(74) *Attorney, Agent, or Firm*—Peter F. Corless; Steven M. Jensen; Edwards Angell Palmer & Dodge

(57) ABSTRACT

A lead-frame-based semiconductor package and a fabrication method thereof are proposed. The semiconductor package includes: a lead frame having a plurality of first and second leads, wherein each first lead is formed with an extending portion smaller in thickness than the first lead in a manner that, an upper surface of the extending portion is flush with an upper surface of the first lead, and a lower surface of the extending portion forms a height difference with respect to a lower surface of the first lead; a chip mounted over the upper surfaces of the extending portions, and electrically connected to the leads by bonding wires; an encapsulant for encapsulating the upper surfaces of leads, upper surfaces of extending portions, chip and bonding wires; and a non-conductive material applied over the lower surfaces of extending portions, wherein the lower surfaces of leads are exposed to outside of the non-conductive material.

11 Claims, 5 Drawing Sheets

E-E sectional view

F-F sectional view

G-G sectional view

LEAD-FRAME-BASED SEMICONDUCTOR PACKAGE AND FABRICATION METHOD THEREOF

CROSS-REFERENCE TO RELATED APPLICATION(S)

This application is a divisional of application U.S. Ser. No. 10/211,422, filed on Aug. 2, 2002, now U.S. Pat. No. 6,806,565.

FIELD OF THE INVENTION

The present invention relates to lead-frame-based semiconductor packages, and more particularly, to a semiconductor package with a lead frame as a chip carrier for accommodating a multi-media card (MMC) chip, and a fabrication method of the semiconductor package.

BACKGROUND OF THE INVENTION

Multi-media cards (MMC) are small-scale integrated circuit (IC) devices having control and memory chips for storing and processing digital video and audio data. Conventionally, MMC chips are packaged and accommodated on a chip carrier such as substrate or tape; however, this substrate-based or tape-based packaging technology is relatively cost-ineffective to implement.

Therefore, Taiwan Publication No. 484222 teaches a lead-frame-based semiconductor package in which a lead frame is employed as a chip carrier for MMC chips. As shown in FIG. 4, this semiconductor package 1 is provided with a lead frame 10 having a plurality of leads 11. Each of the leads 11 is defined with an inner lead portion 110, a middle lead portion 111 and an outer lead portion 112, wherein the middle lead portion 111 interconnects the inner and outer lead portions 110, 112. The inner lead portion 110 is used for chip-mounting purpose, and lower in elevation than the outer lead portion 112 by a predetermined height difference.

A chip 12, such as a MMC chip, is mounted on the inner lead portions 110, and electrically connected to the leads 11 by a plurality of bonding wires 13. Then, an encapsulant 14 is formed to encapsulate the leads 11, chip 12 and bonding wires 13, wherein the outer lead portions 112 are exposed to outside of the encapsulant 14 for mediating electrical connection between the semiconductor package 1 and an external device such as a printed circuit board (not shown). These components encapsulated by the encapsulant 14 can thus be protected against external moisture, contaminants and impact.

However, the above semiconductor package 1 has significant drawbacks. One is difficulty in obtaining desirable planarity of the leads; when the leads 11 are shaped or deformed to form inner lead portions 110, middle lead portions 111 and outer lead portions 112, it may easily lead to poor planarity of the outer lead portions 112, or a R angle (as circled in FIG. 4) at an interconnecting portion between an outer lead portion 112 and a corresponding middle lead portion 111. As such, during a molding process, a resin compound such as epoxy resin used for forming the encapsulant 14 may flash over the outer lead portions 112 that are to be exposed to outside of the encapsulant 14, thereby adversely affecting reliability and quality of electrical connection between the semiconductor package 1 and the external device.

SUMMARY OF THE INVENTION

A primary objective of the present invention is to provide a lead-frame-based semiconductor package and a fabrication method thereof, which can effectively maintain planarity of a lead frame or leads, and prevent resin flash during a molding process, so as to assure reliability and quality of electrical connection for fabricated package products.

In accordance with the above and other objectives, the present invention proposes a lead-frame-based semiconductor package, comprising: a lead frame having a plurality of first leads and second leads, each lead having an upper surface and a lower surface opposed to the upper surface, wherein each of the first leads is formed with an extending portion smaller in thickness than the corresponding one of the first leads in a manner that, an upper surface of the extending portion is flush with the upper surface of the corresponding first lead, and a lower surface of the extending portion forms a predetermined height difference with respect to the lower surface of the corresponding first lead; at least a chip mounted over the upper surfaces of the extending portions; a plurality of bonding wires for electrically connecting the chip to the first and second leads; an encapsulant for encapsulating the upper surfaces of the first and second leads, the upper surfaces of the extending portions, the chip and the bonding wires; and a non-conductive material applied over the lower surfaces of the extending portions, wherein the lower surfaces of the first and second leads are exposed to outside of the non-conductive material. The exposed lower surfaces of the first and second leads are used to mediate electrical connection between the semiconductor package and an external device such as a printed circuit board. The non-conductive material may be the same as or different from a resin material used for forming the encapsulant.

In one embodiment, the first leads of the lead frame are formed with the extending portions respectively; a molding process is performed to form an encapsulant for encapsulating the first and second leads, extending portions, chip and bonding wires, allowing the lower surfaces of the first and second leads and the lower surfaces of the extending portions to be exposed to outside of the encapsulant. Then, a grind process is performed to grind the exposed lower surfaces of the extending portions so as to allow the extending portions to be smaller in thickness than the first leads, wherein the lower surfaces of the extending portions form a predetermined height different with respect to the lower surfaces of the first leads. Thereafter, a non-conductive material is applied over the lower surfaces of the extending portions; an applied thickness of the non-conductive material is equal to the predetermined height different between the lower surfaces of the extending portions and the lower surfaces of the first leads, so as to allow an exposed surface of the non-conductive material to be flush with the lower surfaces of the first leads.

In another embodiment, the extending portions formed at the first leads of the lead frame are subject to a half-etching process for etching the lower surfaces of the extending portion, so as to allow the extending portions to be smaller in thickness than the first leads. Then, an encapsulant is formed to encapsulate the first and second leads, extending portions, chip and bonding wires, allowing the lower surfaces of the first and second leads to be exposed to outside of the encapsulant.

The exposed lower surfaces of the first and second leads may be plated with gold for mediating mediate electrical connection between the semiconductor package and the external printed circuit board.

The above package fabrication method can effectively maintain planarity of the lead frame or leads, and prevent the resin material for forming the encapsulant from flashing over the exposed surfaces of the leads, thereby assuring reliability and quality of electrical connection for fabricated package products.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Preferred embodiments for a lead-frame-based semiconductor package and a fabrication method thereof proposed in the present invention are described in more detail as follows with reference to FIGS. 1A–1E, 2 and 3A–3C.

First Preferred Embodiment

FIGS. 1A–1E illustrate fabrication processes for a semiconductor package 2 according to a first embodiment of the invention.

Figure 1A:
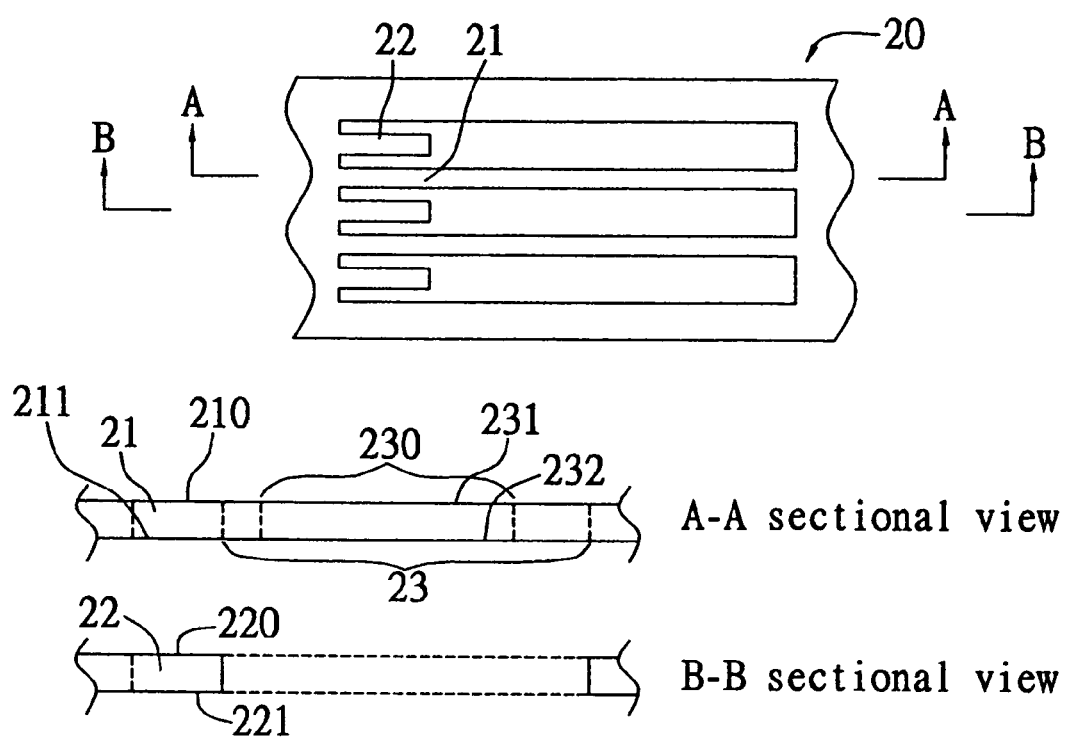
FIGS. 1A–1E are schematic diagrams showing fabrication processes for a semiconductor package according to a first preferred embodiment of the invention.

Referring to FIG. 1A, the first step is to prepare a lead frame 20 having a plurality of first leads 21 and second leads 22. The first and second leads 21, 22 are arranged in a stagger manner that, a first lead 21 is disposed between two adjacent second leads 22, and vice versa.

Each of the first leads 21 has an upper surface 210 and a lower surface 211 opposed to the upper surface 210. And, each of the second leads 22 also has an upper surface 220 and a lower surface 221 opposed to the upper surface 220.

Each of the first leads 21 is formed with an extending portion 23 that has an upper surface 231 and a lower surface 232 opposed to the upper surface 231, wherein the upper and lower surfaces 231, 232 of the extending portion 23 are respectively flush with the upper and lower surfaces 210, 211 of the corresponding one of the first leads 21. A chip attach area 230 is defined on the upper surfaces 231 of the extending portions 23 for chip-mounting purpose.

Figure 1B:
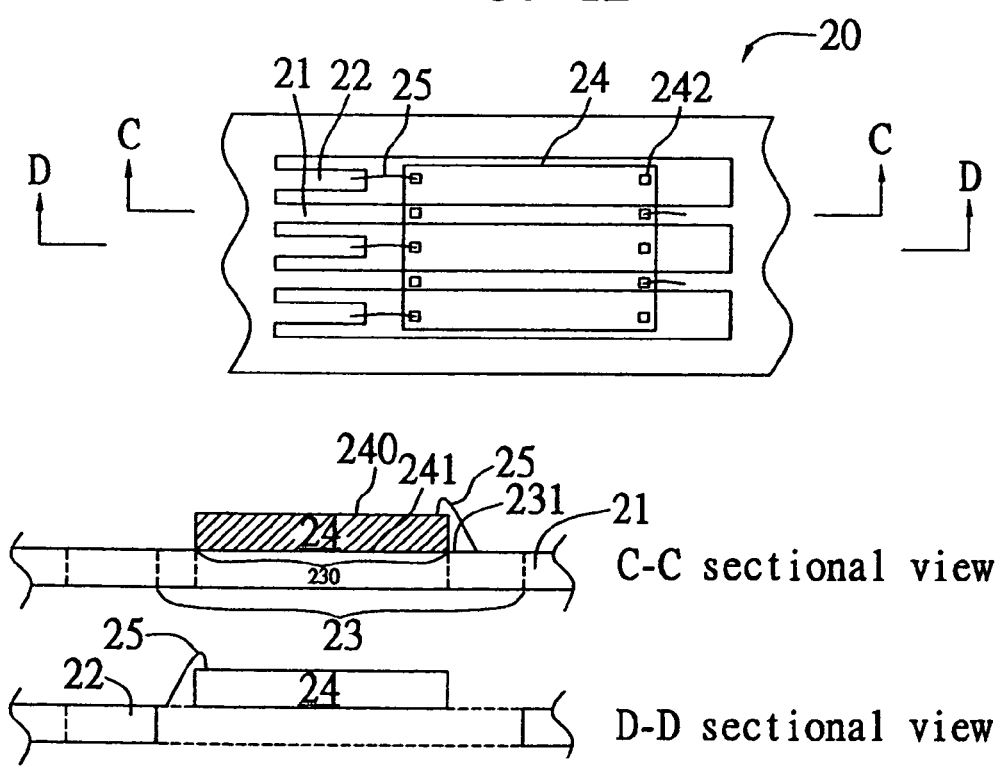

Referring to FIG. 1B, the next step is to prepare at least a chip 24, such as a MMC chip, having an active surface 240 and a non-active surface 241 opposed to the active surface 240, wherein a plurality of bond pads 242 are formed on the active surface 240 of the chip 24.

A die-bonding process is performed to mount the non-active surface 241 of the chip 24 over the chip attach area 230 on the upper surfaces 231 of the extending portions 23.

Then, a wire-bonding process is performed to form a plurality of bonding wires 25 such as gold wires, allowing the bonding wires 25 to be bonded to the bond pads 242 of the chip 24 and to the first and second leads 21, 22 for electrically connecting the chip 24 to the lead frame 20.

Figure 1C:
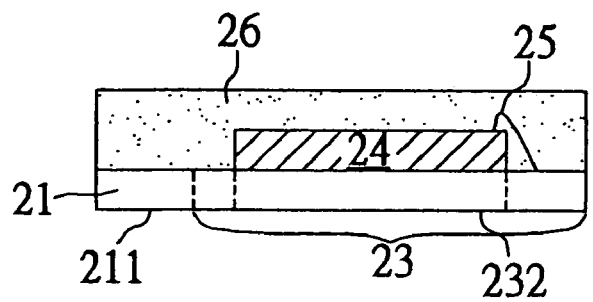
Figure 1C:
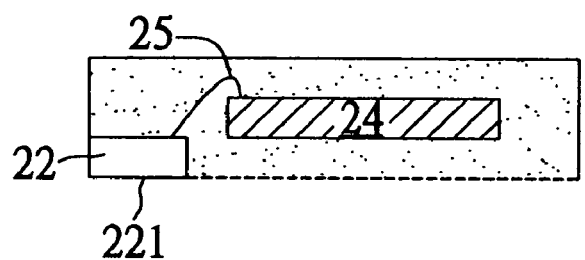

Referring to FIG. 1C, a molding process is performed to form an encapsulant 26 by a resin compound such as epoxy resin. The encapsulant 26 encapsulates the first and second leads 21, 22, extending portions 23, chip 24 and bonding wires 25, wherein the lower surfaces 211, 221 of the first and second leads 21, 22 and the lower surfaces 232 of the extending portions 23 are exposed to outside of the encapsulant 26. These components encapsulated by the encapsulant 26 can thus be protected from being damaged by external moisture, contaminants or impact.

Figure 1D:
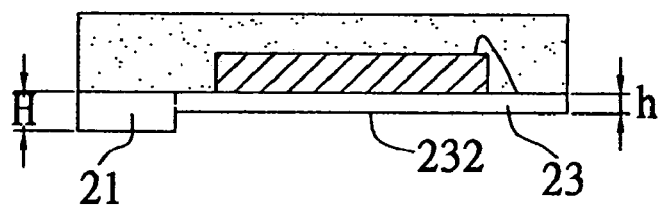

Referring to FIG. 1D, a grinder (not shown) is employed to grind the exposed lower surfaces 232 of the extending portions 23 for reducing thickness of the extending portions 23, so as to allow the reduced thickness h of the extending portions 23 to be smaller than thickness H of the first leads 21.

Figure 1E:
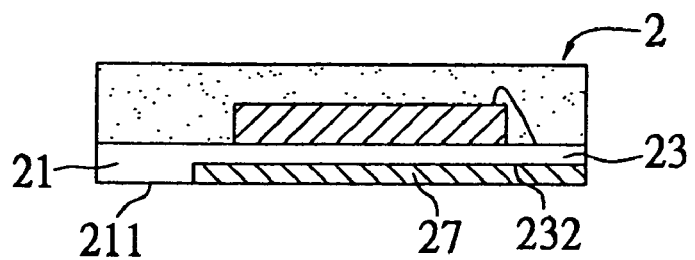
Figure 2:
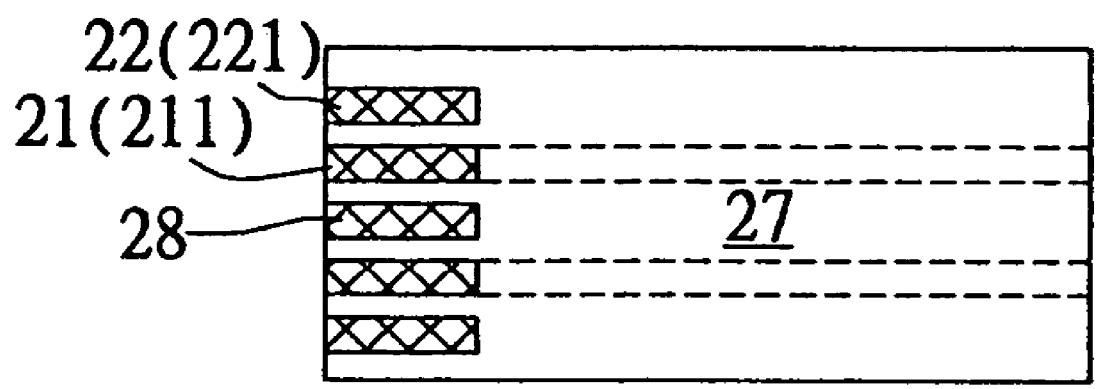
FIG. 2 is a bottom view of the semiconductor package according to the invention.

Referring to FIG. 1E, finally, a non-conductive material 27 is applied over the lower surfaces 232 of the extending portions 23 in a manner that, the non-conductive material 27 is adapted to be flush with the lower surfaces 211 of the first leads 21. As shown in FIG. 2, the exposed lower surfaces 211, 221 of the first and second leads 21, 22 may be respectively plated with a gold layer 28 for use to mediate electrical connection between the semiconductor package 2 and an external device such as a printed circuit board (not shown).

Second Preferred Embodiment

Figure 3A:
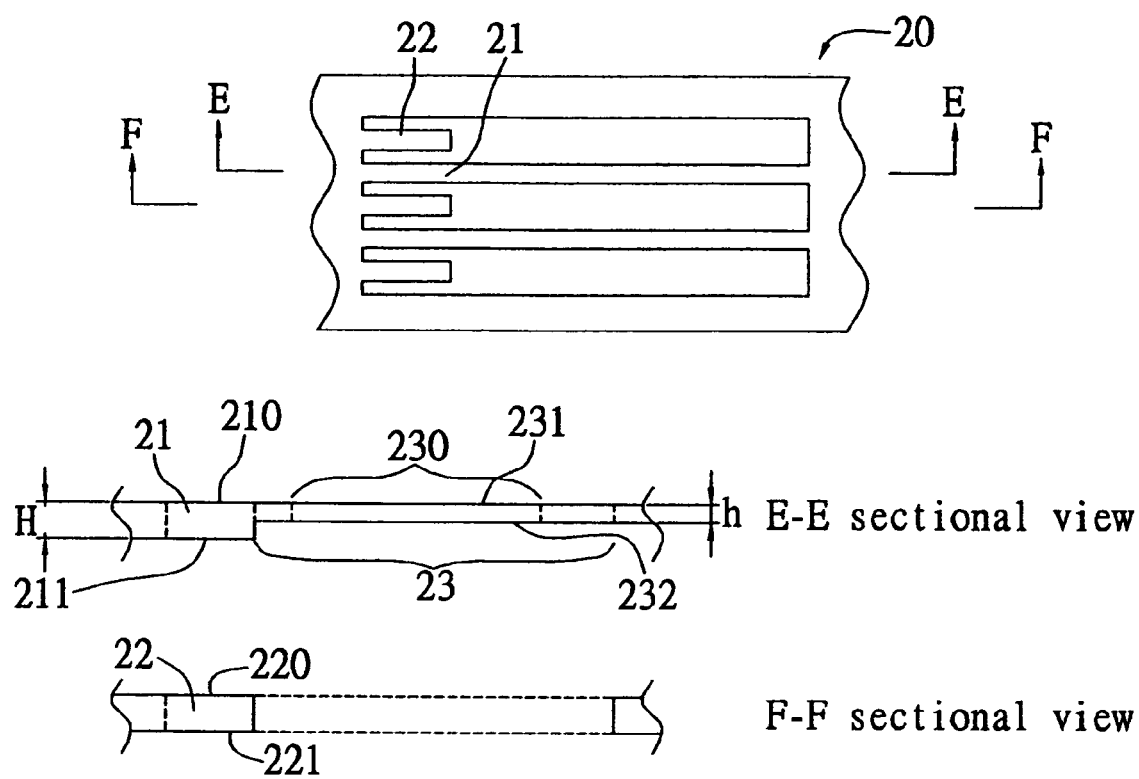
FIGS. 3A–3C are schematic diagrams showing fabrication processes for a semiconductor package according to a second preferred embodiment of the invention.
Figure 3B:
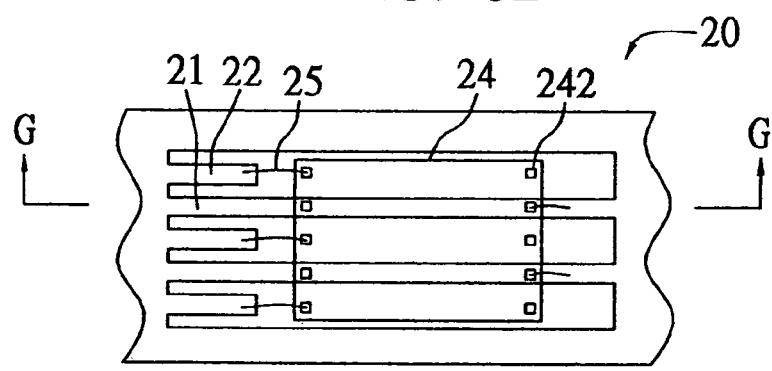
Figure 3B:
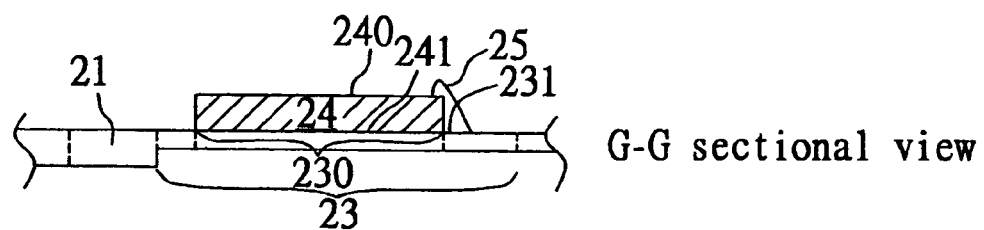
Figure 3C:
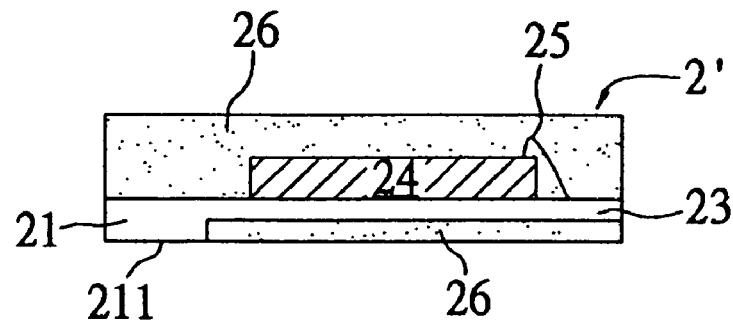
Figure 4:
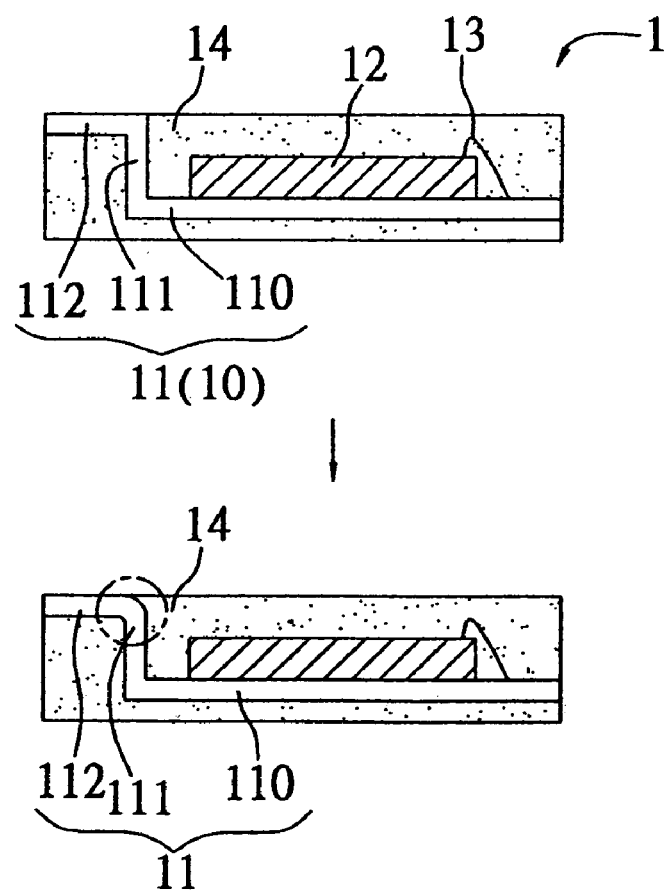
FIG. 4 (PRIOR ART) is a cross-sectional view of a conventional semiconductor package.

FIGS. 3A–3C illustrate fabrication processes for a semiconductor package 2' according to a second preferred embodiment of the invention. This semiconductor package 2' has similar components or elements to the above semiconductor package 2, and thus, same components or elements are herein designated by the same reference numerals as those used in the above first embodiment.

Referring to FIG. 3A, the first steps is to prepare a lead frame 20 having a plurality of first leads 21 and second leads 22. The first and second leads 21, 22 are arranged in a stagger manner that, a first lead 21 is disposed between two adjacent second leads 22, and vice versa.

Each of the first leads 21 has an upper surface 210 and a lower surface 211 opposed to the upper surface 210. And, each of the second leads 22 also has an upper surface 220 and a lower surface 221 opposed to the upper surface 220.

Each of the first leads 21 is formed with an extending portion 23 that has an upper surface 231 and a lower surface 232 opposed to the upper surface 231, wherein the upper and lower surfaces 231, 232 of the extending portion 23 are respectively flush with the upper and lower surfaces 210, 211 of the corresponding one of the first leads 21. A chip attach area 230 is defined on the upper surfaces 231 of the extending portions 23 for chip-mounting purpose. Then, a half-etching process is performed to etch the lower surfaces 232 of the extending portions 23 for reducing thickness of the extending portions 23, so as to allow the reduced thickness h of the extending portions 23 to be smaller than thickness H of the first leads 21, for example, $H=2h$.

Referring to FIG. 3B, a chip-bonding process and a wire-bonding process are performed. At least a chip 24 (such as a MMC chip) is prepared and mounted with its non-active surface 241 over the chip attach area 230 on the upper surfaces 231 of the extending portions 23. Then, a plurality of bonding wires 25 (such as gold wires) are formed and bonded to bond pads 242 formed on an active surface 240 of the chip 24 and to the first and second leads 21, 22, so as to electrically connect the chip 24 to the lead frame 20 by means of the bonding wires 25.

Referring to FIG. 3C, a molding process is performed to form an encapsulant 26 for encapsulating the first and second leads 21, 22, extending portions 23, chip 24 and bonding wires 25, allowing the lower surfaces 211, 221 of the first and second leads 21, 22 to be exposed to outside of the encapsulant 26. The exposed lower surfaces 211, 221 of the first and second leads 21, 22 may be used to mediate electrical connection between the semiconductor package 2' and an external device such as a printed circuit board (not shown).

It should be understood that, partial removal of the extending portions 23 can be implemented by other technologies but not limited to grinding and half-etching processes exemplified as above.

The above fabricated semiconductor package 2, 2', without having to shape leads to form inner lead portions, middle lead portions and outer lead portions as in the prior art, can thereby eliminate problems of poor planarity, R angles, resin flash during molding, and the like. Therefore, the semiconductor package 2, 2' according to this invention can effectively maintain planarity of the lead frame 20 or leads 21, 22, and prevent resin flash over the exposed surfaces 211, 221 of the leads 21, 22, thereby assuring reliability and quality of electrical connection for fabricated package products.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A fabrication method of a lead-frame-based semiconductor package, comprising the steps of:
   preparing a lead frame having a plurality of first leads and second leads, each lead having an upper surface and a lower surface opposed to the upper surface, wherein each of the first leads is formed with an extending portion, and the extending portion has an upper surface and a lower surface respectively flush with the upper surface and the lower surface of the corresponding one of the first leads;
   mounting at least a chip over the upper surfaces of the extending portions;
   forming a plurality of bonding wires for electrically connecting the chip to the first and second leads;
   forming an encapsulant for encapsulating the first and second leads, the extending portions, the chip and the bonding wires, wherein the lower surfaces of the first and second leads and the lower surfaces of the extending portions are exposed to outside of the encapsulant;
   partly removing the extending portions from the exposed lower surfaces thereof, so as to allow the extending portions to be smaller in thickness than the first leads in a manner that, the lower surfaces of the extending portions form a predetermined thickness with respect to the lower surfaces of the first leads; and
   applying a non-conductive material over the lower surfaces of the extending portions.

2. The fabrication method of claim 1, wherein the first and second leads are arranged in a stagger manner that, a first lead is disposed between two adjacent second leads.

3. The fabrication method of claim 1, wherein the chip is a multi-media card (MMC) chip.

4. The fabrication method of claim 1, wherein the exposed lower surfaces of the first and second leads are plated with gold.

5. The fabrication method of claim 1, wherein the extending portions are removed by a grinding process.

6. The fabrication method of claim 1, wherein the non-conductive material is applied with a thickness equal to the predetermined height difference between the lower surfaces of the extending portions and the lower surfaces of the first leads, so as to allow an exposed surface of the non-conductive material to be flush with the lower surfaces of the first leads.

7. A fabrication method of a lead-frame-based semiconductor package, comprising the steps of:
   preparing a lead frame having a plurality of first leads and second leads, each lead having an upper surface and a lower surface opposed to the upper surface, wherein each of the first leads is formed with an extending portion, and the extending portion is partly removed from a lower surface thereof for allowing the extending portion to be smaller in thickness than the corresponding one of the first leads in a manner that, an upper surface of the extending portion is flush with the upper surface of the corresponding first lead, and the lower surface of the extending portion forms a predetermined height difference with respect to the lower surface of the corresponding first lead;
   mounting at least a chip over the upper surfaces of the extending portions;
   forming a plurality of bonding wires for electrically connecting the chip to the first and second leads; and
   forming an encapsulant for encapsulating the first and second leads, the extending portions, the chip and the bonding wires, wherein the lower surfaces of the first and second leads are exposed to outside of the encapsulant.

8. The fabrication method of claim 7, wherein the first and second leads are arranged in a stagger manner that, a first lead is disposed between two adjacent second leads.

9. The fabrication method of claim 7, wherein the extending portion is removed by a half-etching process.

10. The fabrication method of claim 7, wherein the chip is a multi-media card (MMC) chip.

11. The fabrication method of claim 7, wherein the exposed lower surfaces of the first and second leads are plated with gold.

* * * * *